(12) United States Patent
Xue et al.

(10) Patent No.: US 11,222,858 B1
(45) Date of Patent: Jan. 11, 2022

(54) SEMICONDUCTOR PACKAGE HAVING ENLARGED GATE PAD AND METHOD OF MAKING THE SAME

(71) Applicant: ALPHA AND OMEGA SEMICONDUCTOR INTERNATIONAL LP, Sunnyvale, CA (US)

(72) Inventors: Yan Xun Xue, Los Gatos, CA (US); Yueh-Se Ho, Sunnyvale, CA (US); Long-Ching Wang, Cupertino, CA (US); Xiaotian Zhang, San Jose, CA (US); Zhiqiang Niu, Santa Clara, CA (US)

(73) Assignee: ALPHA AND OMEGA SEMICONDUCTOR INTERNATIONAL LP, Sunnyvale, CA (US)

( * ) Notice: Subject to any disclaimer, the term of this patent is extended or adjusted under 35 U.S.C. 154(b) by 0 days.

(21) Appl. No.: 16/906,384

(22) Filed: Jun. 19, 2020

(51) Int. Cl.
| | |
|---|---|
| *H01L 29/66* | (2006.01) |
| *H01L 23/00* | (2006.01) |
| *H01L 23/31* | (2006.01) |
| *H01L 23/495* | (2006.01) |

(52) U.S. Cl.
CPC .......... *H01L 24/03* (2013.01); *H01L 23/3171* (2013.01); *H01L 24/05* (2013.01); *H01L 23/495* (2013.01); *H01L 2224/0362* (2013.01); *H01L 2224/05124* (2013.01); *H01L 2224/05647* (2013.01); *H01L 2924/13091* (2013.01)

(58) Field of Classification Search
CPC combination set(s) only.
See application file for complete search history.

(56) References Cited

U.S. PATENT DOCUMENTS

| | | | |
|---|---|---|---|
| 9,806,186 B2 * | 10/2017 | Harrington, III | ... H01L 29/0696 |
| 9,825,137 B2 * | 11/2017 | Kim | ........................ H01L 29/407 |
| 2016/0380072 A1 * | 12/2016 | Zhong | ................... H01L 29/402 |
| | | | 257/139 |

* cited by examiner

*Primary Examiner* — Niki H Nguyen
(74) *Attorney, Agent, or Firm* — Chen-Chi Lin

(57) ABSTRACT

A semiconductor package fabrication method comprises the steps of providing a wafer, applying a seed layer, forming a photo resist layer, plating a copper layer, removing the photo resist layer, removing the seed layer, applying a grinding process, forming metallization, and applying a singulation process. A semiconductor package comprises a silicon layer, an aluminum layer, a passivation layer, a polyimide layer, a copper layer, and metallization. In one example, an area of a contact area of a gate clip is smaller than an area of a gate copper surface. The area of the contact area of the gate clip is larger than a gate aluminum surface. In another example, an area of a contact area of a gate pin is larger than an area of a gate copper surface. The area of the contact area of the gate pin is larger than a gate aluminum surface.

20 Claims, 7 Drawing Sheets

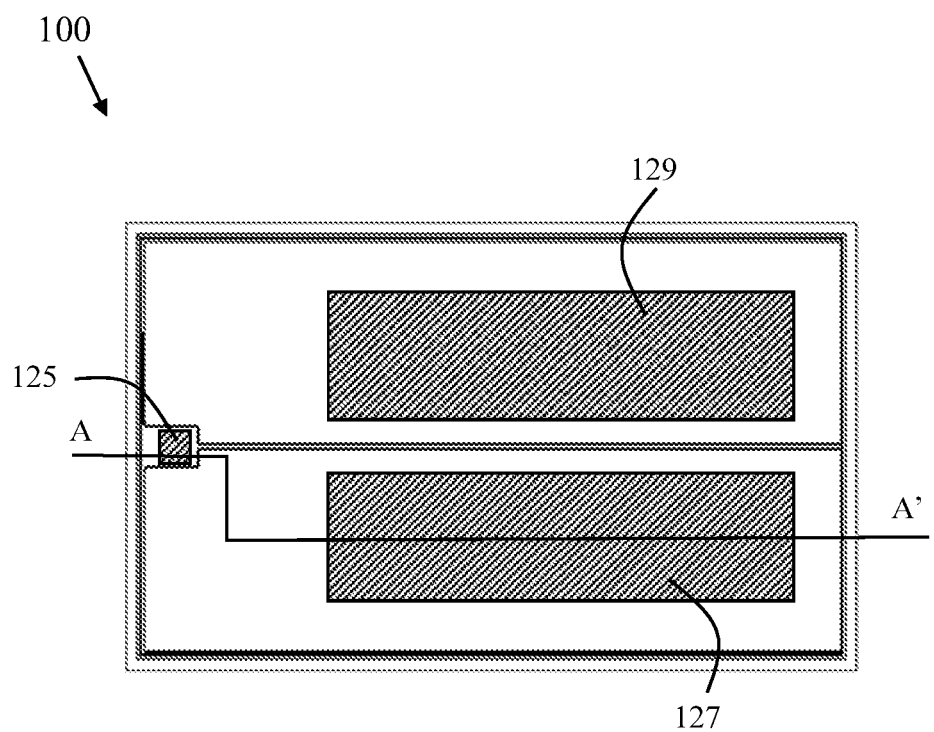
FIG. 1Ai
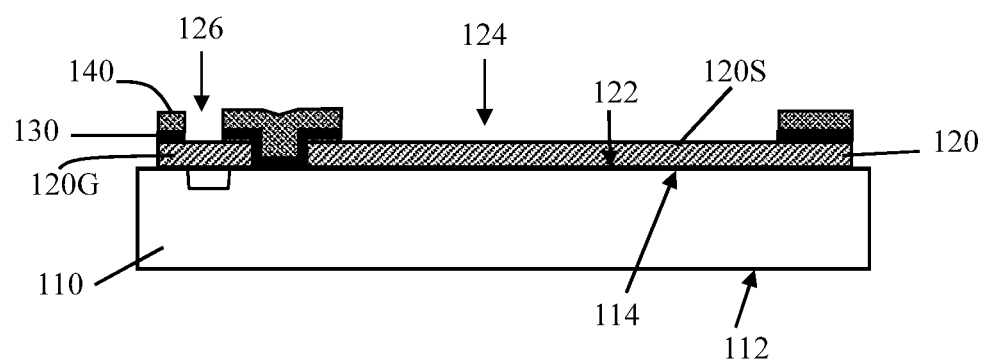
FIG. 1Aii

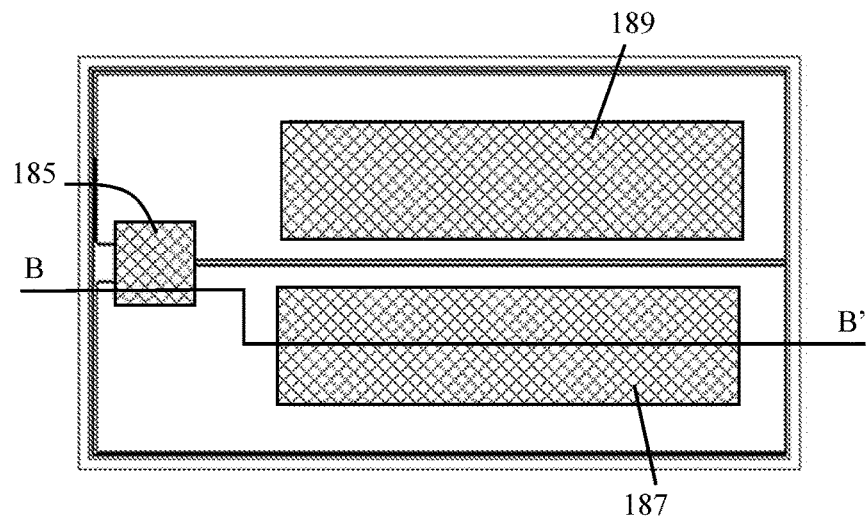
FIG. 1Fi
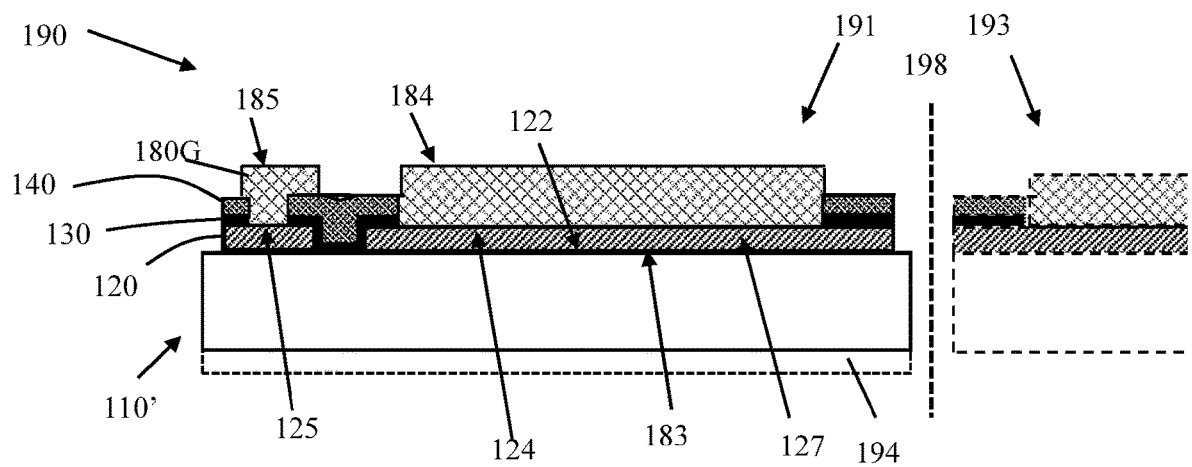
FIG. 1Fii

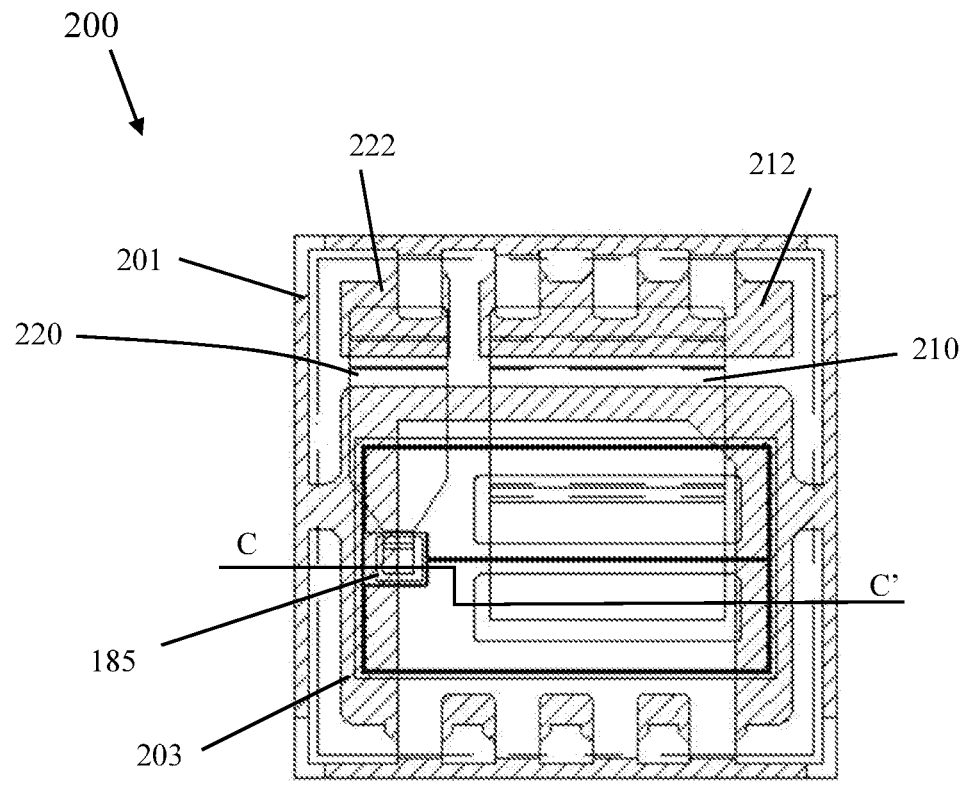
FIG. 2Ai
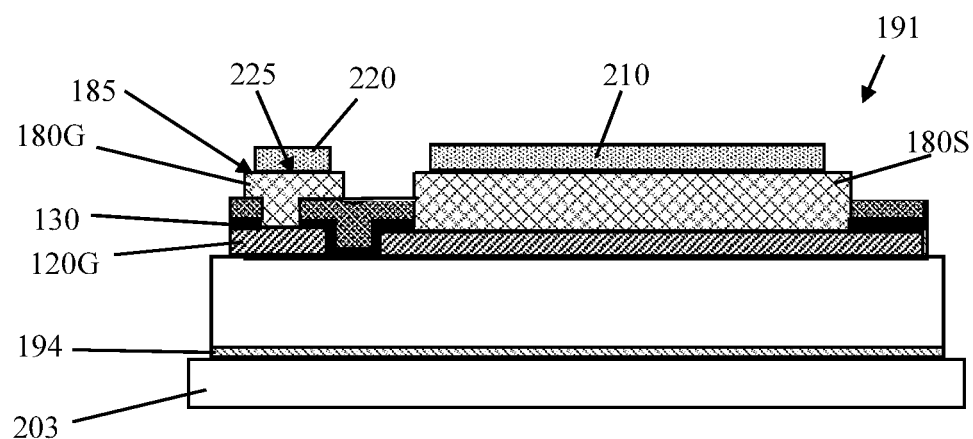
FIG. 2Aii

SEMICONDUCTOR PACKAGE HAVING ENLARGED GATE PAD AND METHOD OF MAKING THE SAME

FIELD OF THE INVENTION

This invention relates generally to a semiconductor package and a method of making the same. More particularly, the present invention relates to a semiconductor package having an enlarged gate pad.

BACKGROUND OF THE INVENTION

With advance of semiconductor manufacturing technologies, power semiconductor chips are produced with ever reducing chip size without compromising their power handling capabilities. As the size of a power semiconductor chip continues to shrink, a size of its gate pad reduces accordingly. For applications require small physical dimension, such as mobile application, power semiconductor chips are packaged into package size of 3.3 mm by 3.3 mm or even less. Clip bonding technology provides benefits of higher current handling and lower resistance for a power semiconductor device, but results in larger area in process compared to wire bonding technology. To fully utilize a chip size, it is required to maximize a size of a source pad, and minimize the size of the gate pad. A mixed bonding process had been provided as a solution to overcome the small gate pad difficulty, namely, clip bonding the source pad and wire bonding the gate pad. However, this mixed bonding process increases the complexity of the process, increases the fabrication cost, and increases contamination. In general, a gate pad of 0.3 mm by 0.3 mm or larger is suitable for clip bonding. A smaller gate pad of 0.1 mm by 0.1 mm must use wire bonding. A wire bonding of the gate pad following a clip bonding of the source pad often has reliability issue including the wire not sticking on the gate pad. Solvent of the solder paste used in the clip bonding of the source pad will contaminate the gate pad during the reflow process.

The copper plating of the present disclosure replaces conventional NiPdAu plating. Clip bonding of gate pad and clip bonding of source pad of the present disclosure replace conventional mixed bonding process. The process is simplified. The fabrication cost is reduced. The contamination is reduced.

SUMMARY OF THE INVENTION

The present invention discloses a method for fabricating a plurality of semiconductor packages. The method comprises the steps of providing a wafer, applying a seed layer, forming a photo resist layer, plating a copper layer, removing the photo resist layer, removing the seed layer, applying a grinding process, forming metallization, and applying a singulation process.

A semiconductor package comprises a semiconductor layer, an aluminum layer, a passivation layer, a polyimide layer, a copper layer, and metallization. In one example, an area of a contact area of a gate clip is smaller than an area of a gate copper surface. The area of the contact area of the gate clip is larger than a gate aluminum surface. In another example, an area of a contact area of a gate pin is larger than an area of a gate copper surface. The area of the contact area of the gate pin is larger than a gate aluminum surface.

BRIEF DESCRIPTION OF THE DRAWINGS

FIG. 1Aii is a cross-sectional view along AA' of FIG. 1Ai.

FIG. 2Ai is a top view and FIG. 2Aii is a cross-sectional view of a semiconductor package in examples of the present disclosure.

DETAILED DESCRIPTION OF THE INVENTION

Figure 3:
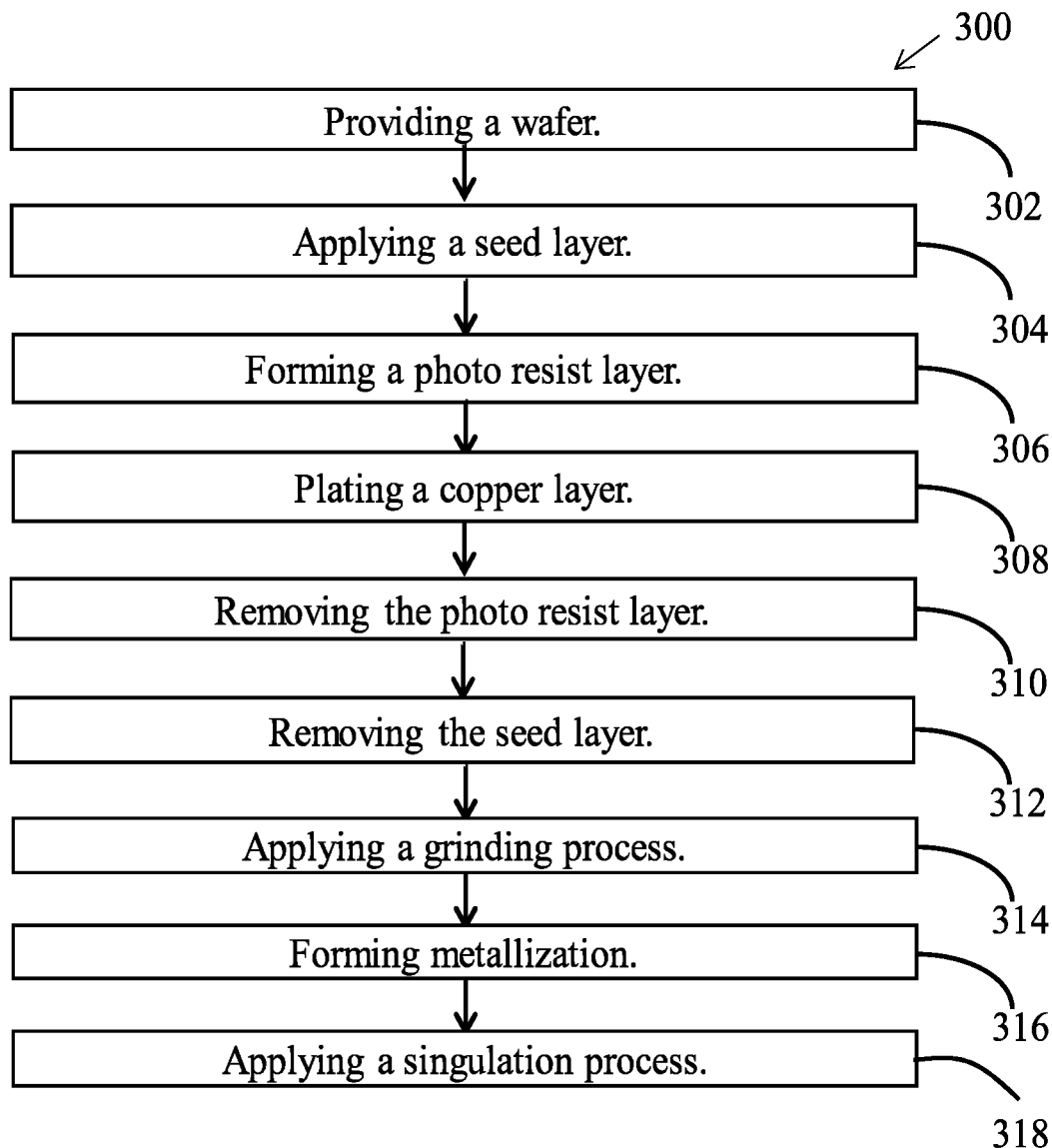
FIG. 3 is a flowchart of a process to fabricate a plurality of semiconductor packages in examples of the present disclosure.

FIG. 3 is a flowchart of a process 300 to fabricate a plurality of semiconductor packages in examples of the present disclosure.

The process 300 may start from block 302. FIGS. 1Ai and 1Fi show top views and FIGS. 1Aii, 1B, 1C, 1D, 1E, and 1Fii show cross-sectional views of the steps of the process to fabricate a plurality of semiconductor packages in examples of the present disclosure. For simplicity, only one semiconductor chip is shown in each of FIGS. 1Ai and 1Fi and FIGS. 1Aii, 1B, 1C, 1D, and 1E. In FIG. 1Fii, a portion of an adjacent semiconductor chip 193 is shown in dashed lines.

In block 302, referring now to FIGS. 1Ai and 1Aii, a wafer 100 comprising a plurality of power semiconductor chips is provided. Each of the power semiconductor chip on the wafer 100 comprises a semiconductor substrate layer 110 having a power semiconductor device formed thereon, a first metal layer 120, preferably an aluminum layer, a passivation layer 130, and a polyimide layer 140. In one example, the first metal layer 120 is disposed above a front surface 114 of the semiconductor substrate layer 110. In another example, the first metal layer 120 is patterned into a first source metal pad 120S of a larger area and a first gate metal pad 120G of a smaller area separated from the first source metal pad. In examples of the present disclosure, an area of the first source metal pad 120S is at least fifty times of an area of the first gate metal pad 120G. The first source metal pad 120S electrically connects to a source contact region (not shown) of the power semiconductor device formed at a top portion of the semiconductor substrate layer 110 and the first gate metal pad 120G electrically connects to a gate contact region (not shown) of the power semiconductor device formed at a top portion of the semiconductor substrate layer 110. The passivation layer 130 is above the first metal layer 120 and partially fills a first gap separating the first source metal pad 120S and the first gate metal pad 120G. The polyimide layer 140 is above the passivation layer 130 and is much thicker than the passivation layer 130. The polyimide layer 140 fills the rest of the gap to provide a substantial flat top surface across the gap separating the first source metal pad 120S and the first gate metal pad 120G.

The passivation layer 130 and the polyimide layer 140 are patterned with one or more source passivation openings 124 over the first source metal pad 120S and a gate passivation opening 126 over the first gate metal pad 120G. In examples of the present disclosure, an area of each of the one or more source passivation openings 124 is at least ten times of an area of the gate passivation opening 126. The first gate metal pad 120G comprises an exposed gate aluminum surface 125 through the gate passivation opening 126. A center of the gate passivation opening 126 substantially aligns to a center of the first gate metal pad 120G with an area of the gate passivation opening 126 less than a top surface area of the entire first gate metal pad 120G. The first source metal pad 120S further comprises a first exposed source aluminum surface 127 and a second exposed source aluminum surface 129 through the one or more source passivation openings 124. In another example, the polyimide layer 140 is optional and the passivation layer 130 fills the gap to provide a substantial flat top surface across the gap separating the first source metal pad 120S and the first gate metal pad 120G. Block 302 may be followed by block 304.

Figure 1B:
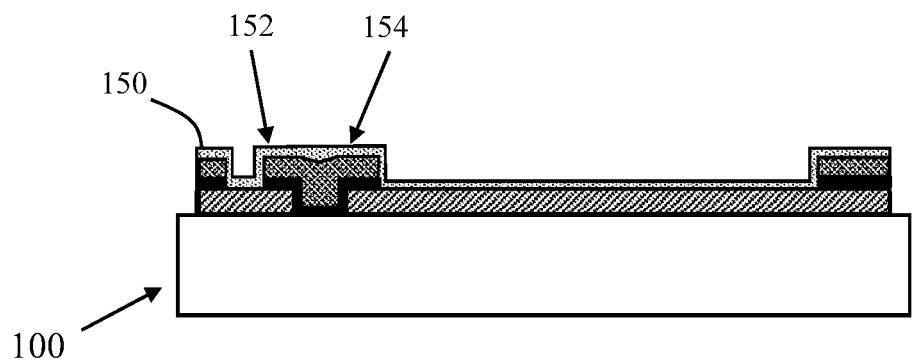
FIGS. 1Ai and 1Fi show top views and FIGS. 1Aii, 1B, 1C, 1D, 1E, and 1Fii show cross-sectional views of the steps of the process to fabricate a plurality of semiconductor packages in examples of the present disclosure.
FIG. 1Fii is a cross-sectional view along BB' of FIG. 1Fi.

In block 304, referring now to FIG. 1B, a seed layer 150 is applied to a front surface of the wafer 100. In examples of the present disclosure, the seed layer is applied by a physical vapor deposition (PVD) process. The seed layer 150 comprises a first portion 152 and a second portion 154. The first portion 152 of the seed layer 150 will be diffused into the second metal layer 180 (in one example, the second metal layer 180 is a copper layer) of FIG. 1D. The second portion 154 of the seed layer 150 will be removed in block 312. In examples of the present disclosure, the seed layer 150 comprises TiCu. Block 304 may be followed by block 306.

Figure 1C:
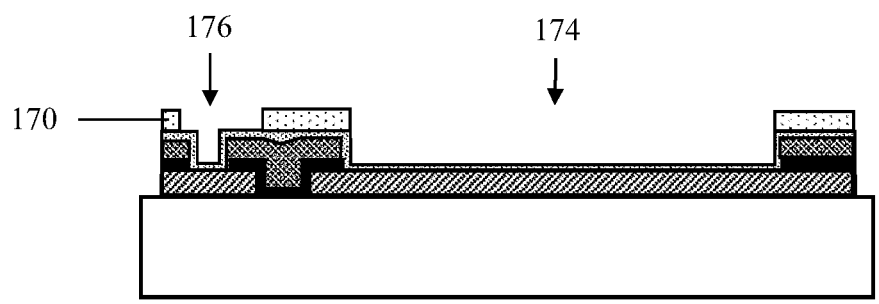

In block 306, referring now to FIG. 1C, a photo resist layer 170 is formed above the seed layer 150. The photo resist layer 170 is patterned with one or more source photo resist openings 174 over the first source metal pad 120S and a gate photo resist opening 176 over the first gate metal pad 120G. In example of the present disclosure, an area of each of the one or more source photo resist openings 174 is at least ten times of an area of the gate photo resist opening 176. In one example, edges of the one or more source photo resist openings 174 are substantially aligned with edges of the one or more source passivation openings 124 such that the one or more source photo resist openings 174 are substantially the same shapes and sizes of the one or more source passivation openings 124. In another example, edges of the gate photo resist opening 176 recess away from the edges of the gate passivation opening 126 such that an area of the gate photo resist opening 176 is larger than an area of the gate passivation opening 126. The photo resist layer 170 covers the second portion 154 of the seed layer 150. Block 306 may be followed by block 308.

Figure 1D:
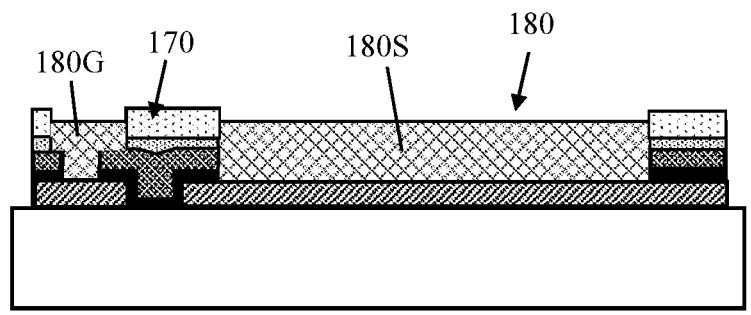

In block 308, referring now to FIG. 1D, a second metal layer 180, preferably a copper layer, is plated over the first portion 152 of the seed layer 150 not covered by the photo resist layer 170. The first portion 152 of the seed layer 150 is diffused into the copper layer in this process. The second metal layer 180 comprises a second source metal pad 180S having a top surface area defined by the one or more source photo resist openings 174 and a second gate metal pad 180G having a top surface area defined by the gate photo resist opening 176. The photo resist layer 170 separates the second gate metal pad 180G from the second source metal pad 180S. Block 308 may be followed by block 310.

Figure 1E:
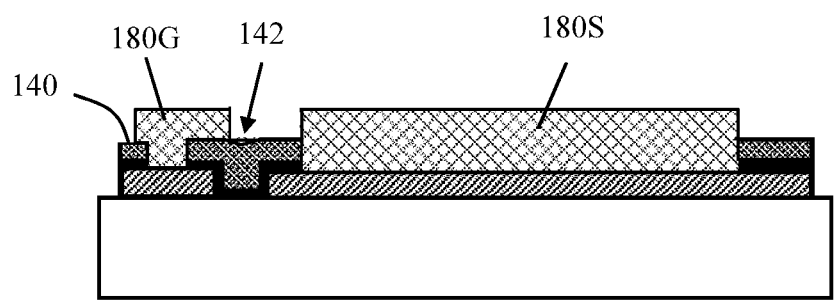

In block 310, referring now to FIG. 1E, the photo resist layer 170 of FIG. 1D is removed by a stripping process. Block 310 may be followed by block 312.

In block 312, still referring to FIG. 1E, the second portion 154 of the seed layer 150 of FIG. 1B is removed by an etching process. A portion of a front surface 142 of the polyimide layer 140 is exposed through a second gap separating the second source metal pad 180S and the second gate metal pad 180G. The second gap is at least as wide as the first gap separating the first source metal pad 120S and the first gate metal pad 120G. In one example, a top surface edge of the second gate metal pad extends beyond a first edge of the passivation layer 130 and the polyimide layer 140 interfacing the second gate metal pad towards a second edge of the passivation layer 130 and the polyimide layer 140 interfacing the second source metal pad. In another example, an edge of the second source metal pad 180S is substantially align to the second edge of the passivation layer 130 and the polyimide layer 140, the exposed front surface 142 of the polyimide layer is located between the first edge and the second edge. Block 312 may be followed by block 314.

In block 314, referring now to FIGS. 1Fi and 1Fii, a grinding process is applied on a wafer back surface 112 of FIG. 1Aii of the semiconductor substrate layer 110 of FIG. 1Aii forming a thinned wafer 190. In examples of the present disclosure, a thickness of the wafer before grinding is in a range from 700 μm to 800 μm. A thickness of the thinned wafer 190 is in a range from 80 μm to 120 μm. Block 314 may be followed by block 316.

In block 316, referring now to FIG. 1Fii, metallization 194 is formed on a back surface 192 of the thinned wafer 190. In examples of the present disclosure, the metallization 194 comprises a titanium layer, a nickel layer, and a silver layer. The metallization 194 forms bottom drain electrode of the power semiconductor device. Block 316 may be followed by block 318.

In block 318, still referring to FIG. 1Fii, a singulation process 198 separates a semiconductor chip 191 from adjacent semiconductor chip 193 (shown in dashed lines) from the wafer 100 so as to form a plurality of semiconductor chips each comprises a power semiconductor device.

FIG. 1Fii shows a semiconductor chip 191 comprising a power semiconductor device. The semiconductor chip 191 comprises a semiconductor substrate layer 110', a first metal layer 120, a passivation layer 130, a polyimide layer 140, and a second metal layer 180 formed on the front side of the semiconductor substrate layer 110', and a back-surface metallization 194 formed on the back side of the semiconductor substrate layer 110'. In one example, the first metal layer 120 comprises an aluminum layer. In another example, the first metal layer 120 is patterned into a first source metal pad 120S and a first gate metal pad 120G separated from the first source metal pad 120S. The first source metal pad 120S electrically connects to a source contact region (not shown) of the power semiconductor device, and the first gate metal pad 120G electrically connects to a gate contact region (not shown) of the power semiconductor device. The passivation layer 130 is above the first metal layer 120. The polyimide layer 140 is above the passivation layer 130. The passivation layer 130 and the polyimide layer 140 are patterned with one or more source passivation openings 124 over the first source metal pad 120S and a gate passivation opening 126 over the first gate metal pad 120G.

The second metal layer 180 fills the one or more source passivation openings 124 over the first source metal pad 120S and the gate passivation opening 126 over the first gate metal pad 120G. The second metal layer 180 further extend above top surface of the passivation layer 130 and the polyimide layer 140. The second metal layer 180 comprises a second gate metal pad 180G and a second source metal pad 180S. In one example, the second gate metal pad 180G disposed above the first gate metal pad 120G. The second gate metal pad 180G has a substantially flat top surface having an area larger than the gate passivation opening 126 that define an exposed gate aluminum surface 125 of the first gate metal pad 120G. In another example, the second metal layer 180 comprises a copper plated layer.

The second gate metal pad 180G comprises an exposed gate copper surface 185 on a front surface 184 of the semiconductor chip provided a gate electrode of the power semiconductor device. The second gate metal pad 180G electrically connects to the gate contact region (not shown) of the power semiconductor device through the first gate metal pad 120G. An area of the exposed gate copper surface 185 of the second gate metal pad 180G is larger than an area of the exposed gate aluminum surface 125 of the first gate metal pad 120G exposure through the gate passivation opening 126. In an alternate example, the top surface area of the second gate metal pad 180G is larger than an entire top surface area of the first gate metal pad 120G.

The second source metal pad 180S electrically connected to the source contact region (not shown) of the power semiconductor device through the first source metal pad 120S provides a source electrode of the power semiconductor device. As shown in FIG. 1Fi, the second source metal pad 180S further comprises a first exposed source copper surface 187 and a second exposed source copper surface 189 on the front surface of the semiconductor chip overlaying the first exposed source aluminum surface 127 and the second exposed source aluminum surface 129 respectively.

In examples of the present disclosure, the exposed gate copper surface 185 of block 308 (FIG. 1Fi) is of a first rectangular shape. The area of the exposed gate aluminum surface 125 of block 302 (FIG. 1Ai) is of a second rectangular shape.

The back-surface metallization 194 formed on the back side of the semiconductor substrate layer 110' extends over substantially an entire back surface of the semiconductor substrate layer 110'. In one example, the semiconductor chip comprises a vertical power semiconductor device and the back-surface metallization 194 is provided as a drain electrode. A voltage applied to the gate electrode control a current flow between the source electrode and the drain electrode.

FIG. 2Ai is a top view and FIG. 2Aii is a cross-sectional view along CC' line of a semiconductor package 200 in examples of the present disclosure.

In examples of the present disclosure, the semiconductor chip 191 including a power semiconductor device is disposed on a lead frame 201 with its bottom drain electrode (metallization 194) electrically connected to a die paddle 203 of the lead frame. A source conductive member 210 electrically and mechanically connects the first exposed source copper surface 187 and the second exposed source copper surface 189 to a source lead 212 of the lead frame 201, and a gate conductive member 220 electrically and mechanically connects the exposed gate copper surface 185 to a gate lead 222 of the lead frame 201. The gate lead 222, the source lead 212 and the die paddle 203 are separated from each other. An optional drain lead may electrically connect to the die paddle 203. At least portions of bottom surfaces of the gate lead 222, the source lead 212 and the die paddle 203 or the optional drain lead exposed through a bottom of a molding compound (not shown) that encapsulates the lead frame 201, the semiconductor chip 191, the source conductive member 210 and the gate conductive member 220.

In examples of the present disclosure, the semiconductor chip 191 includes a semiconductor transistor, such as a metal-oxide semiconductor field-effect transistor (MOSFET). The exposed gate copper surface 185 of block 308 (FIG. 1Fi) is electrically connected to the exposed gate aluminum surface 125 of block 302 (FIG. 1Ai). A voltage applied to the gate lead controls a current flow between the source lead and the drain lead.

In a prefer example of the present disclosure, the gate conductive member 220 may be a metal clip connected to the exposed gate copper surface 185 of the second gate metal pad 180G through a conductive adhesive agent such as a solder or a conductive epoxy. In another prefer example the gate conductive member 220 includes a metal ribbon connected to the exposed gate copper surface 185 with or without an adhesive agent. A contact area 225 between the conductive member 220 and the exposed gate copper surface 185 is smaller than the area of the exposed gate copper surface 185. The contact area 225 between the gate conductive member 220 and the exposed gate copper surface 185 is larger than the exposed gate aluminum surface 125 through the gate passivation opening 126 of block 302 (FIG. 1Ai).

Figure 2B:
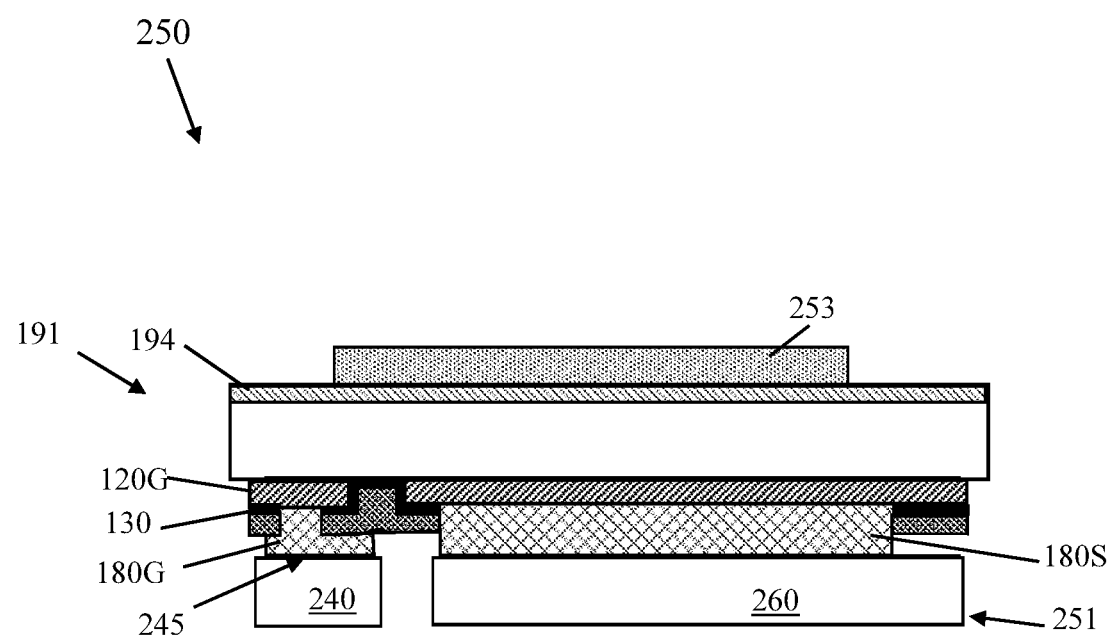
FIG. 2B is a cross-sectional view of another semiconductor package in examples of the present disclosure.

FIG. 2B is a cross-sectional view of a semiconductor package 250 in examples of the present disclosure.

In examples of the present disclosure, the semiconductor chip 191 including a power semiconductor device is flipped and disposed on a lead frame 251 with the second source metal pad 180S electrically connected to a source base 260 of the lead frame 251 and the second gate metal pad 180G electrically connected to a gate base 240 of the lead frame 251. A drain conductive member 253 electrically and mechanically connects the bottom drain electrode (metallization 194) of the semiconductor chip 191 to a drain lead (not shown) of the lead frame 251. The gate base 240, the source base 260 and the drain lead are separated from each other. The gate base 240 may connected to a gate lead (not shown) and the source base 260 may connected to a source lead. At least portions of bottom surfaces of the gate lead, the source lead and the drain lead exposed through a bottom of a molding compound (not shown) that encapsulates the lead frame 251, the semiconductor chip 191, and the drain conductive member 253.

In examples of the present disclosure, the semiconductor chip 191 includes a semiconductor transistor, such as a MOSFET. The exposed gate copper surface 185 is electrically connected to the exposed gate aluminum surface 125 of block 302 (FIG. 1Ai). A voltage applied to the gate base controls a current flow between the source lead and the drain lead.

In a prefer example of the present disclosure, the exposed gate copper surface 185 of the second gate metal pad 180G may be connected to the gate base 240 through a conductive adhesive agent such as a solder or a conductive epoxy. A contact area 245 between the gate base 240 and the exposed gate copper surface 185 is larger than the exposed gate aluminum surface 125 through the gate passivation opening 126 of block 302 (FIG. 1Ai).

In examples of the present disclosure, the semiconductor chip 191 comprises a metal-oxide semiconductor field-effect transistor (MOSFET) having a gate and a source disposed on a front surface and a drain on a back surface. The semiconductor chip 191 may comprise other type of vertical semiconductor devices with a control electrode dispose on a main surface of the semiconductor chip to control a current flowing through opposite main surfaces of the semiconductor chip, such as an insulated gate control transistor (IGBT).

Those of ordinary skill in the art may recognize that modifications of the embodiments disclosed herein are possible. For example, a size of the area of the exposed gate copper surface 185 may vary. Other modifications may occur to those of ordinary skill in this art, and all such modifications are deemed to fall within the purview of the present invention, as defined by the claims.

The invention claimed is:

1. A method for fabricating a plurality of power semiconductor chips, the method comprising the steps of:
   providing a wafer comprising:
   a plurality of power semiconductor devices, each power semiconductor device of the plurality of power semiconductor devices comprising:
   a first metal layer disposed on a front side of the wafer, the first metal layer being patterned into a first source metal pad and a first gate metal pad; and
   a passivation layer overlaying the first source metal pad and the first gate metal pad, the passivation layer being patterned to expose partially a top surface of the first source metal pad through one or more source passivation openings of the passivation layer and to expose partially a top surface of the first gate metal pad through a gate passivation opening of the passivation layer;
   depositing a seed layer onto the front side of the wafer;
   disposing and patterning a photo resist layer above the seed layer;
   plating a second metal layer onto the front side of the wafer in areas exposed through the photo resist layer;
   removing the photo resist layer;
   removing a remaining portion of the seed layer not covered by the second metal layer;
   grinding a back side of the wafer forming a thinned wafer;
   forming metallization on a back surface of the thinned wafer; and
   applying a singulation process forming the plurality of power semiconductor chips.

2. The method of claim 1, wherein the step of plating the second metal layer forms a second gate metal pad and a second source metal pad separated by the photo resist; wherein the second gate metal pad overlays the first gate metal pad; wherein the second source metal pad overlays the first source metal pad; and wherein an area of a top surface of the second gate metal pad is larger than the gate passivation opening of the passivation layer.

3. The method of claim 2, wherein the wafer is further provided with a polyimide layer overlaying the passivation layer; and wherein the polyimide layer is patterned to exposed partially the top surface of the first source metal pad through the one or more source passivation openings of the passivation layer and to exposed partially the top surface of the first gate metal pad through the gate passivation opening of the passivation layer.

4. The method of claim 3, wherein the second gate metal pad fills the gate passivation opening over the first gate metal pad; and wherein the second gate metal pad further extends above a top surface of the passivation layer and a top surface of the polyimide layer.

5. The method of claim 4, wherein the first metal layer comprises an aluminum layer and the step of plating the second metal layer comprises a sub-step of plating a copper layer.

6. The method of claim 5, wherein each power semiconductor device of the plurality of power semiconductor devices further comprises a metal-oxide semiconductor field-effect transistor (MOSFET); and
   wherein the second gate metal pad formed in the sub-step of plating the copper layer is electrically connected to a gate contact region of the MOSFET through the first gate metal pad.

7. A power semiconductor chip comprising:
   a semiconductor substrate comprising a power semiconductor device;
   a first metal layer overlaying the semiconductor substrate, the first metal layer being patterned into a first source metal pad of a larger area and a first gate metal pad of a smaller area separated from the first source metal pad, the first source metal pad being electrically connected to a source contact region of the power semiconductor device, and the first gate metal pad being electrically connected to a gate contact region of the power semiconductor device;
   a passivation layer overlaying the first metal layer, the passivation layer being patterned to expose partially a top surface of the first source metal pad through one or more source passivation openings of the passivation layer and to expose partially a top surface of the first gate metal pad through a gate passivation opening of the passivation layer, each of the one or more source passivation openings is at least ten times an area of the gate passivation opening; and
   a second metal layer overlaying the passivation layer and the first metal layer, the second metal layer comprising a second source metal pad and a second gate metal pad separated from the second source metal pad, the second source metal pad filling the one or more source passivation openings of the passivation layer and electrically connected to the first source metal pad, the second gate metal pad filling the gate passivation opening of the passivation layer and electrically connected to the first gate metal pad;
   wherein a top surface area of the second gate metal pad is larger than the gate passivation opening of the passivation layer.

8. The power semiconductor chip of claim 7, further comprising a polyimide layer overlaying the passivation layer, the polyimide layer being patterned to expose partially the top surface of the first source metal pad through the one or more source passivation openings of the passivation layer and to expose partially the top surface of the first gate metal pad through the gate passivation opening of the passivation layer.

9. The power semiconductor chip of claim 8, wherein the first metal layer comprises an
   aluminum layer.

10. The power semiconductor chip of claim 9, wherein the second metal layer comprises a
    copper layer.

11. The power semiconductor chip of claim 10, wherein the gate passivation opening of the passivation layer is less than 0.3 mm×0.3 mm, wherein the second gate metal pad has a top surface area larger than 0.3 mm×0.3 mm.

12. The power semiconductor chip of claim 10, wherein the semiconductor device comprises a metal-oxide semiconductor field-effect transistor (MOSFET), and wherein the second gate metal pad is electrically connected to the gate contact region of the MOSFET through the first gate metal pad.

13. A semiconductor package comprising:
    a lead frame;
    a semiconductor chip disposed on the lead frame, the semiconductor chip comprising:
    a semiconductor substrate comprising a power semiconductor device;
    an aluminum layer overlaying a front surface of the semiconductor substrate, the aluminum layer being patterned into a first source metal pad of a larger area and a first gate metal pad of a smaller area separated from the first source metal pad, the first source metal pad being electrically connected to a source contact region of the power semiconductor device, and the first gate metal pad being electrically connected to a gate contact region of the power semiconductor device;

a passivation layer overlaying the aluminum layer;

a polyimide layer above the passivation layer;

a plated copper layer; and a back-surface metallization disposed on a back surface of the semiconductor substrate opposite the front surface of the semiconductor substrate;

wherein the passivation layer and the polyimide layer are patterned to expose partially a top surface of the first source metal pad through one or more source passivation openings and to expose partially a top surface of the first gate metal pad through a gate passivation opening;

wherein the plated copper layer comprises a second source metal pad and a second gate metal pad separated from the second source metal pad;

wherein the second source metal pad fills the one or more source passivation openings of the passivation layer and is electrically connected to the first source metal pad;

wherein the second gate metal pad filling the gate passivation opening of the passivation layer and is electrically connected to the first gate metal pad; and wherein a top surface area of the second gate metal pad is larger than the gate passivation opening of the passivation layer.

14. The semiconductor package of claim 13, wherein the lead frame comprises a die pad, a gate lead and a source separated from one another; and wherein the semiconductor chip is disposed on the die pad with the back-surface metallization being electrically attached to the die pad.

15. The semiconductor package of claim 14, wherein a gate conductive member electrically connects the second gate metal pad on the semiconductor chip to the gate lead of the lead frame; and wherein a source conductive member electrically connects the second source metal pad on the semiconductor chip to a source lead of the lead frame.

16. The semiconductor package of claim 15, wherein a contact area between the gate conductive member and the second gate metal pad is larger than a top surface area of the first gate metal pad exposed through the smaller passivation opening.

17. The semiconductor package of claim 16, wherein the gate conductive member comprises a gate clip; and wherein the source conductive member comprises a source clip.

18. The semiconductor package of claim 13, wherein the lead frame comprises a source base, a gate base and a drain lead separated from one another; wherein the semiconductor chip is flipped disposed on the lead frame with the second source metal pad being electrically connected to the source base and the second gate metal pad being electrically connected to the gate base; and wherein a drain conductive member electrically connects the back-surface metallization to the drain lead.

19. The semiconductor package of claim 18, wherein a contact area between the gate base and the second gate metal pad is larger than a top surface area of the first gate metal pad exposed through the smaller passivation opening.

20. The semiconductor package of claim 13, wherein the semiconductor device comprises a metal-oxide semiconductor field-effect transistor (MOSFET), and wherein the second gate metal pad is electrically connected to the gate contact region of the MOSFET through the first gate metal pad.

* * * * *